United States Patent
Byom et al.

(10) Patent No.: US 8,683,456 B2
(45) Date of Patent: Mar. 25, 2014

(54) TEST PARTITIONING FOR A NON-VOLATILE MEMORY

(75) Inventors: Matthew Byom, Campbell, CA (US); Nir J. Wakrat, Los Altos, CA (US); Kenneth Herman, San Jose, CA (US)

(73) Assignee: Apple Inc., Cupertino, CA (US)

(*) Notice: Subject to any disclaimer, the term of this patent is extended or adjusted under 35 U.S.C. 154(b) by 816 days.

(21) Appl. No.: 12/502,128

(22) Filed: Jul. 13, 2009

(65) Prior Publication Data

US 2011/0010698 A1    Jan. 13, 2011

(51) Int. Cl.
- *G06F 9/44* (2006.01)
- *G01R 33/12* (2006.01)
- *G11C 7/00* (2006.01)
- *G06F 13/00* (2006.01)
- *G11C 29/00* (2006.01)

(52) U.S. Cl.
USPC ........... 717/168; 324/210; 365/201; 711/173; 714/718

(58) Field of Classification Search
None
See application file for complete search history.

(56) References Cited

U.S. PATENT DOCUMENTS

| | | | |
|---|---|---|---|
| 4,570,217 A | 2/1986 | Allen et al. | |
| 6,631,086 B1 | 10/2003 | Bill et al. | |
| 6,813,678 B1 | 11/2004 | Sinclair et al. | |
| 6,823,507 B1 | 11/2004 | Srinivasan et al. | |
| 6,834,364 B2 | 12/2004 | Krech, Jr. et al. | |
| 7,334,159 B1 * | 2/2008 | Callaghan | 714/30 |
| 7,447,869 B2 * | 11/2008 | Kruger et al. | 711/205 |
| 7,945,826 B2 | 5/2011 | Kameda et al. | |
| 8,041,882 B2 | 10/2011 | Jachalsky et al. | |
| 8,060,797 B2 | 11/2011 | Hida et al. | |
| 8,179,367 B2 | 5/2012 | Kitaura | |
| 2002/0124129 A1 | 9/2002 | Zilberman | |
| 2006/0053357 A1 | 3/2006 | Rajski et al. | |
| 2006/0168475 A1 | 7/2006 | Segers et al. | |
| 2006/0200726 A1 | 9/2006 | Gittins et al. | |
| 2008/0052446 A1 | 2/2008 | Lasser et al. | |
| 2008/0209294 A1 * | 8/2008 | Brink et al. | 714/735 |
| 2010/0122148 A1 | 5/2010 | Flynn et al. | |
| 2010/0332949 A1 | 12/2010 | d'Abreu et al. | |
| 2011/0010698 A1 | 1/2011 | Byom et al. | |
| 2011/0239064 A1 | 9/2011 | Byom et al. | |

FOREIGN PATENT DOCUMENTS

EP    0794484 A2 *   3/1997

OTHER PUBLICATIONS

Jim Cooke, "Micron® e-MMC™ Embedded Memory Simplifies High-Capacity Storage for Mobile and Embedded Systems,", pp. 1-7, 2007 Micron Technology, Inc.

(Continued)

*Primary Examiner* — Henry Tsai
*Assistant Examiner* — Juanito Borromeo
(74) *Attorney, Agent, or Firm* — Van Court & Aldridge LLP (57) ABSTRACT

Systems and methods are provided for testing a non-volatile memory, such as a flash memory. The non-volatile memory may be virtually partitioned into a test region and a general purpose region. A test application may be stored in the general purpose region, and the test application can be executed to run a test of the memory locations in the test region. The results of the test may be stored in the general purpose region. At the completion of the test, the test results may be provided from the general purpose region and displayed to a user. The virtual partitions may be removed prior to shipping the electronic device for distribution.

23 Claims, 6 Drawing Sheets

(56) References Cited

OTHER PUBLICATIONS

Chan Huan Ginn;, "A novel bitmap analysis technique—test sensitivity intensity bitmap," Physical and Failure Analysis of Integrated Circuits, 2002. I PFA 2002. Proceedings of the 9th IPFA, pp. 105-109, 2002.

Mohammad, M.G.; Saluja, K.K.;, "Electrical model for program disturb faults in non-volatile memories," VLSI Design, 2003. Proceedings of the 16th International Conference on VLSI Design, pp. 217-222, Jan. 4-8, 2003.

* cited by examiner

TEST PARTITIONING FOR A NON-VOLATILE MEMORY

FIELD OF THE INVENTION

This can relate to systems and methods for testing a non-volatile memory with partitions.

BACKGROUND OF THE DISCLOSURE

NAND flash memory, as well as other types of non-volatile memories ("NVMs"), are commonly used in electronic devices. For example, consumer electronics such as portable media players often include flash memory as mass storage to store music, videos, and other media. Some consumer electronics also use flash memory to store firmware and other information or program code needed for operation of the device.

Flash memory and other NVM are composed of arrays of memory cells, where each memory cell can store one or more bits of information. Vendors typically supply NVMs where a small proportion of the memory cells are defective. An electronic device can handle these defective cells, as well as any cells that become defective over time, using various techniques. For example, the electronic device can employ an error correcting code and perform bad block management.

To ensure that an NVM used in an electronic device does not initially contain too many defective cells, device manufacturers sometimes build in components for testing the NVMs. In particular, the electronic device may be provided with a dedicated test memory, which can be used to store various parameters and program code to test the NVM memory arrays. The testing components can produce a pass/fail indicator to signal whether the overall NVM meets the device manufacturer's or vendor's specification for defective cells.

SUMMARY OF THE DISCLOSURE

Systems and methods are disclosed for testing a non-volatile memory, such as NAND flash memory. In particular, the systems and methods provide techniques for preparing an electronic device including a non-volatile memory for distribution and for generating detailed results when testing a non-volatile memory.

In some embodiments, an electronic device is provided that includes a non-volatile memory and a system-on-a-chip ("SoC"). The SoC may be configured to operate in one of at least two modes, including a testing mode and a shipping mode. The testing mode may be used, for example, during the manufacturing process to test the electronic device before shipment, and the shipping mode may be used for normal operation of the electronic device by, for example, an end user. To convert from one mode to another, firmware/software of the electronic device may be reconfigured to include different software modules, for example.

In shipping mode, an application running on the SoC can communicate with the NVM through a file system and a translation layer (e.g., a flash translation layer). The translation layer may map a logical address provided by the file system into a suitable physical address corresponding to any suitable memory location in the NVM. Because of this mapping, an application executed in shipping mode and the file system may not be able to determine the actual memory locations used to store data.

In testing mode, a test application running on the SoC can communicate with the NVM through either the file system and translation layer or through a separate access layer, which may sometimes be referred to as the "test region access layer." The translation layer may be configured to use only a subset of the available physical addresses when performing logical-to-physical address mappings, and the testing layer access layer may be configured to use the remaining physical addresses. Thus, in testing mode, two virtual partitions of the NVM may be created. For example, the first virtual partition may be a general purpose region and the second virtual partition may be a test region. The general purpose region may be controlled by the translation layer and may be used to store the test application and various test results, among other things. The test region may be controlled by the testing area access layer, and may be the area of the NVM that is tested by the test application and test region access layer.

In some embodiments, the access layer may allow a test application to request that a particular memory location in the test region be accessed. Thus, when accessing memory locations in the test region, the test application can essentially work with physical addresses. In this way, the test application may be able to generate detailed and thorough test results, such as which physical addresses of memory locations contain defective memory cells.

Also, by creating virtual partitions in testing mode, the electronic device may implement a built-in test that does not require an additional memory for storing the test application and other test-related data or results.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Figure 1:
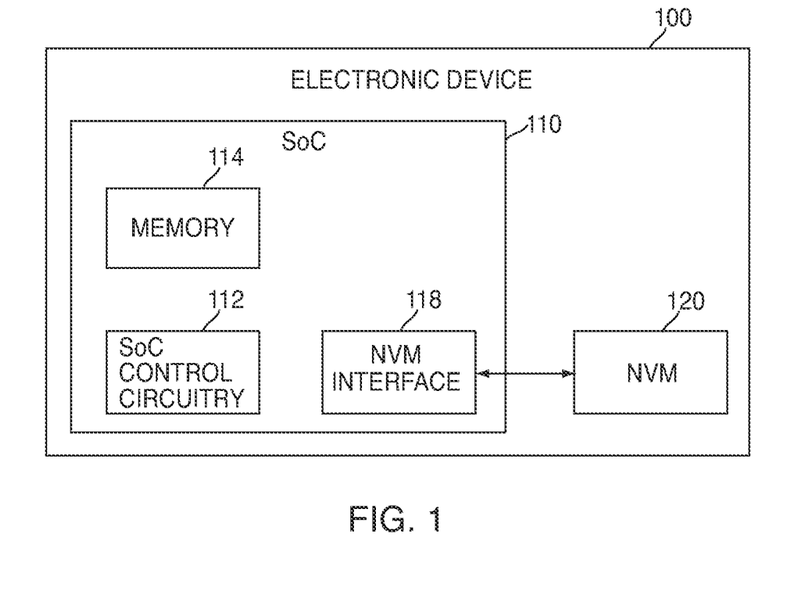
FIG. 1 is a schematic view of an electronic device configured in accordance with some embodiments of the invention.

FIG. 1 is a schematic view of electronic device 100. In some embodiments, electronic device 100 can be or can include a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, a laptop computer, and any other suitable type of electronic device.

Electronic device 100 can include system-on-a-chip ("SoC") 110 and non-volatile memory ("NVM") 120. Non-volatile memory 120 can include a NAND flash memory based on floating gate or charge trapping technology, EPROM, EEPROM, Ferroelectric RAM ("FRAM"), magnetoresistive RAM ("MRAM"), any other known or future type of non-volatile memory technology, or any combination thereof. NVM 120 can be organized into "blocks" that may each be erasable at once, and further organized into "pages" that may each be programmable and readable at once. NVM 120 can include multiple integrated circuits, where each integrated circuit may have multiple blocks. Each memory location (e.g., page or block) of NVM 120 can be addressed using a physical address (e.g., physical page address or physical block address).

FIG. 1, as well as later figures and the various disclosed embodiments may be sometimes be described in terms of using flash technology. However, this is not intended to be limiting, and any other type of non-volatile memory can be implemented instead. Electronic device 100 can include other components, such as a power supply or any user input or output components, which are not depicted in FIG. 1 to prevent overcomplicating the figure.

System-on-a-chip 110 can include SoC control circuitry 112, memory 114, and NVM interface 118. SoC control circuitry 112 can control the general operations and functions of SoC 110 and the other components of SoC 110 or device 100. For example, SoC control circuitry 112 may respond to and process user inputs received from a user input component (not shown) of device 100. During operation, SoC control circuitry 112 may issue read or write commands to NVM interface 118 to obtain data from or to store data in NVM 120. For clarity, data that SoC control circuitry 112 may request for storage or retrieval may be referred to as "user data," even though the data may not be directly associated with a user or user application. Rather, the user data can be any suitable sequence of digital information generated or obtained by SoC control circuitry 112 (e.g., via an application or operating system).

SoC control circuitry 112 can include any combination of hardware, software, and firmware, and any components, circuitry, or logic operative to drive the functionality of electronic device 100. For example, SoC control circuitry 112 can include one or more processors that operate under the control of software/firmware stored in NVM 120 or memory 114.

Memory 114 can include any suitable type of volatile or non-volatile memory, such as dynamic random access memory ("DRAM"), synchronous dynamic random access memory ("SDRAM"), double-data-rate ("DDR") RAM, cache memory, read-only memory (ROM), or any combination thereof. Memory 114 may include a data source that can temporarily store user data for programming into or reading from non-volatile memory 120. In some embodiments, memory 114 may act as the main memory for any processors implemented as part of SoC control circuitry 112.

NVM interface 118 may include any suitable combination of hardware and software configured to act as a driver or interface between SoC control circuitry 112 and NVM 120. For any software modules included in NVM interface 118, corresponding program code may be stored in NVM 120 or memory 114.

NVM interface 118 can perform a variety of functions that allow SoC control circuitry 112 to access NVM 120 and to manage the memory locations (e.g., pages, blocks, super blocks, integrated circuits) of NVM 120 and the data stored therein (e.g., user data). For example, NVM interface 118 can interpret the read or write commands from SoC control circuitry 112, perform garbage collection, perform wear leveling, and generate read and program instructions compatible with a bus protocol employed by NVM 120.

While NVM interface 118 and SoC control circuitry 112 are shown as separate modules, this is intended only to simplify the description of the embodiments. It should be understood that these modules may share hardware or software components or both. For example, a processor implemented as part of SoC control circuitry 112 may execute a software-based memory driver for NVM interface 118. Accordingly, portions of SoC control circuitry 112 and NVM interface 118 may sometimes be referred to collectively as "control circuitry."

FIG. 1 illustrates an electronic device where NVM 120 does not have its own controller. In other embodiments, electronic device 100 can include a target device, such as a flash or SD card, that includes NVM 120 and some or all of portions of NVM interface 118 (e.g., a translation layer and access layer, discussed below). In these embodiments, SoC 110 or SoC control circuitry 112 may act as the host controller for the target device. For example, as the host controller, SoC 110 can issue read and write requests to the target device.

In some embodiments, electronic device 100 can have multiple modes of operation. In particular, electronic device 100 may operate in a shipping mode or a testing mode. In shipping mode, electronic device 100 may be configured in accordance with the normal operations advertised to a consumer. For example, if electronic device 100 is a portable media player, electronic device 100 may be operable to play music, videos, or other media when in a shipping mode. In testing mode, electronic device 100 may allow a user (e.g., a technician or engineer) to initiate a test of NVM 120. In this way, the manufacturer of electronic device 100 can confirm that any defects present in NVM 120 fall within some predetermined limits, and may also gather detailed statistics about the initial defects of NVM 120. By having these two modes, the user can initially configure electronic device 100 to operate in a testing mode, and may then re-configure electronic device 100 to operate in a shipping mode prior to releasing device 100 for sale or distribution.

Figure 2:
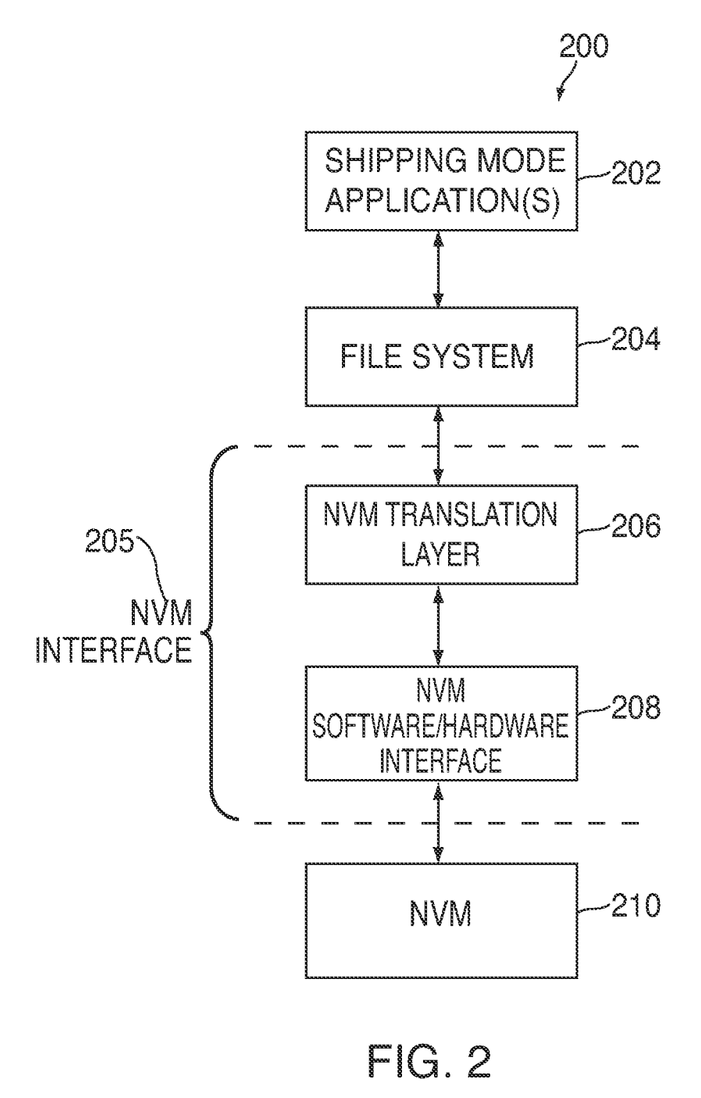
FIG. 2 is a high level, layered view of an electronic device configured in shipping mode in accordance with some embodiments of the invention.

FIG. 2 is a high level, layered view of an electronic device 200, which illustrates the configuration of various software and hardware modules in a shipping mode of device 200. Electronic device 200 may have any of the features and functionalities of electronic device 100 of FIG. 1, and vice versa. Electronic device 200 can include one or more shipping mode applications 202, file system 204, NVM interface 205, and NVM 210. NVM interface 205 can include NVM or flash translation layer ("FTL") 206 and NVM or flash software/hardware interface 208. In other embodiments, a NVM other than flash memory may be implemented in electronic device 200.

Shipping mode application 202 may be a software module that can provide any suitable type of functionality to a user. The functionality may be based on the intended purpose of electronic device 200. During execution, shipping mode application 202 may need to store information in or obtain information from NVM 210. Shipping mode application 202 may instruct file system 204 to store or obtain this information.

File system 204 can include any suitable type of file system, such as a File Allocation Table ("FAT") file system, and may be part of the operating system of electronic device 200. Responsive to instructions from application 202 to store or retrieve information, file system 204 may provide access requests to FTL 206. File system 204 may manage file and folder structures for application 202 and the operating system. Thus, along with each read or write command, file system 204 can provide a logical address to indicate where the user data should be read from or written to.

File system 204 may provide read and write requests that are not directly compatible with NVM 210. For example, file system 204 may provide logical addresses that use conventions or protocols typical of hard-drive-based systems, but not to flash memories. A hard-drive-based system, unlike flash memory, can overwrite a memory location without first performing a block erase, and hard drives do not need wear leveling to increase the lifespan of the device. Therefore, FTL 206 can perform any memory-specific functions or vendor-specific functions, or both, to handle file system requests and perform other management functions in a manner suitable for NVM 210.

For example, FTL 206 can convert the logical address received from file system 204 to a physical address. The physical address may correspond to an actual location of NVM 210. On a write operation, FTL 206 can map the logical address to a free, erased physical location on NVM 210. On a read operation, FTL 206 can use the logical address to determine the physical address at which the requested data is stored. Since each NVM may have a different layout depending on the size or vendor of the NVM, this mapping operation may be memory and/or vendor specific.

FTL 206 can perform any other suitable functions in addition to performing logical-to-physical address mapping. For example, FTL 206 can perform any of the other functions that are typical of flash translation layers, such as garbage collection and wear leveling.

As shown in FIG. 2, FTL 206 may be part of one module of NVM interface 205. In some embodiments, FTL 206 may be a software module that can operate as part of a memory driver for NVM 210. In other embodiments, FTL 206 may be a module with any combination of hardware and software, and may be implemented in a target device (e.g., a flash card). NVM interface 205 can further include NVM or flash software/hardware interface 208. NVM or flash software/hardware interface 208 can include any remaining software and/or hardware modules necessary for NVM interface 205 to communicate with NVM 210. For example, software/hardware interface 208 can include a bus controller to communicate with NVM 210 using a bus protocol, data rate, and other specifications of NVM 210.

Returning to FTL 206, as described above, FTL 206 can convert logical addresses to physical addresses corresponding to any suitable location of NVM 210. Thus, if file system 204 attempts to access NVM 210 multiple times using the same sequence of logical addresses, FTL 206 may likely access a different sequence of physical addresses each time. Therefore, application 202 and file system 204 may be unable to predict where data is actually being stored in NVM 210.

However, for testing purposes, it may be beneficial for the control circuitry of the electronic device to be able to control which memory locations are actually being tested. Accordingly, the software modules of NVM interface 205 may have a different configuration in testing mode than in shipping mode.

Figure 3:
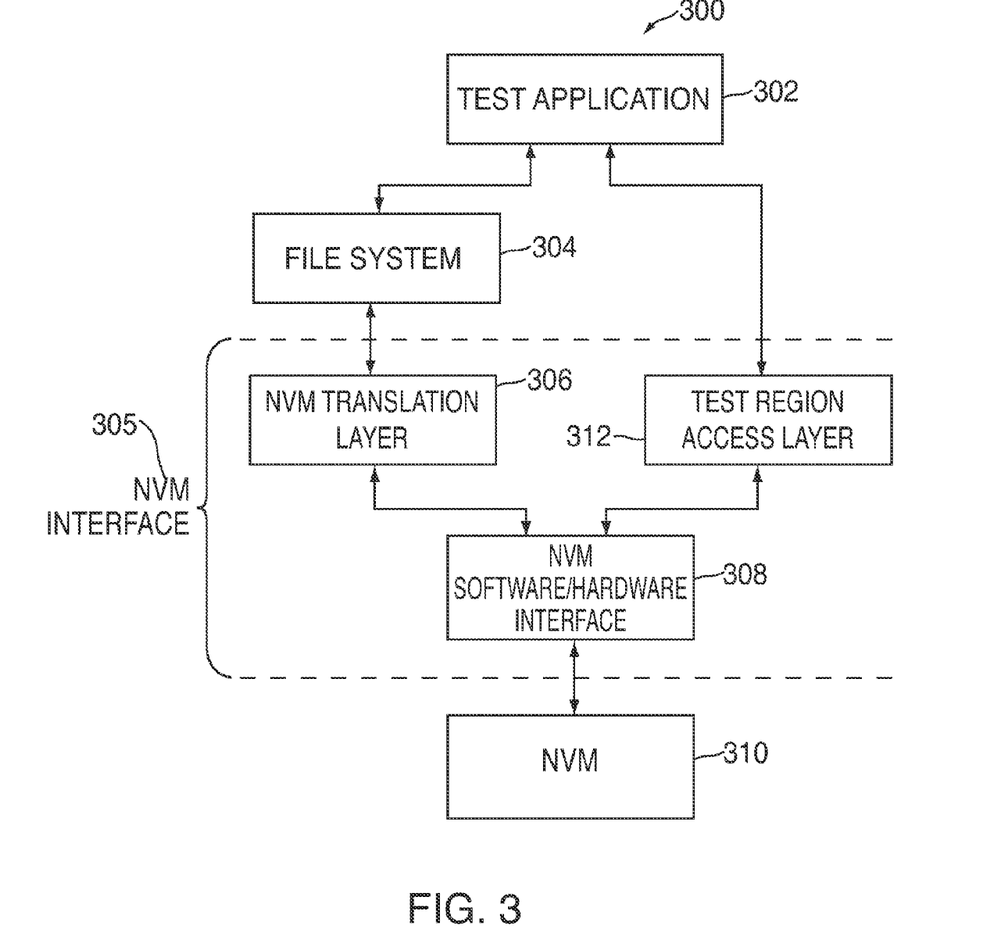
FIG. 3 is a high level, layered view of an electronic device configured in testing mode in accordance with some embodiments of the invention.

FIG. 3 is a high level, layered view of electronic device 300, which illustrates the configuration of various software and hardware modules of electronic device 300 in a testing mode. Electronic device 300 can include test application 302, file system 304, NVM interface 305, and NVM 310. NVM interface 305 can include NVM or flash translation layer ("FTL") 306, test region access layer 312, and NVM or flash software/hardware interface 308.

Electronic device 300 may have any of the features and functionalities of electronic devices 100 and 200 of FIGS. 1 and 2, respectively, and vice versa. In particular, the components in FIG. 3 can have any of the features and functionalities of their like-named components in FIG. 2. Accordingly, only the components that are substantially different from those in FIG. 2 are described, and it should be understood that the description of similar components in FIG. 2 may apply to those in FIG. 3.

Instead of having only a NVM or flash translation layer controlling the physical addresses of NVM 310, FTL 306 and test region access layer 312 both may control physical addresses of NVM 312. In particular, FTL 306 may be constrained as to which physical addresses FTL 306 can use when mapping logical addresses to physical addresses. Thus, FTL 306 may control only a portion of the memory locations available in NVM 310. The remaining physical addresses, and therefore the remaining memory locations, may be used by test region access layer 312, which can be implemented in hardware or software. This way, NVM 310 may be virtually partitioned into a general purpose region or partition, which may be controlled by FTL 306, and a test region or partition, which may be controlled by test region access layer 312. The partitions may be "virtual" because NVM 310 may not be physically partitioned and no reformatting of the hardware may take place.

Figure 4:
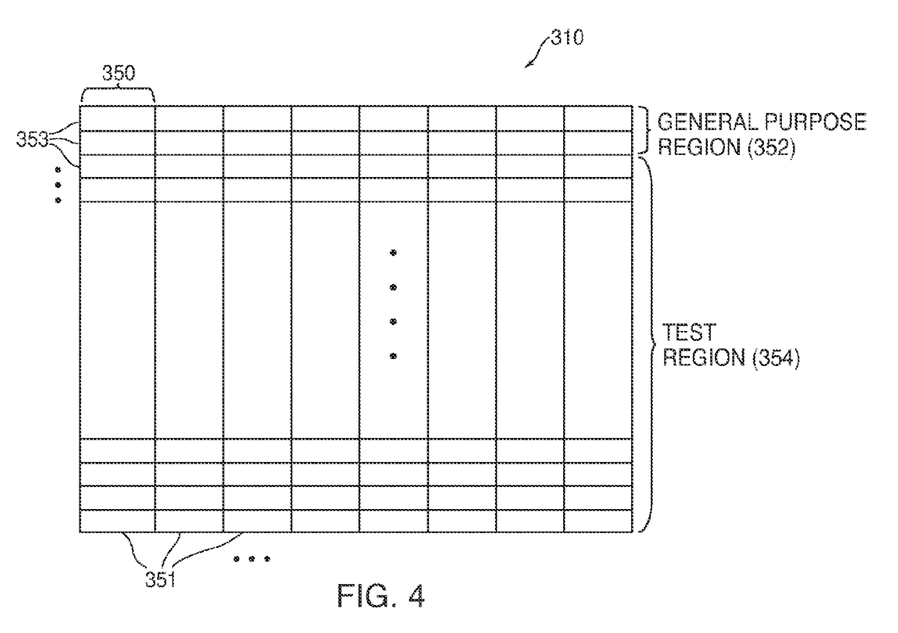
FIG. 4 illustrates virtual test partitions for a non-volatile memory of the electronic device of FIG. 3 in accordance with some embodiments of the invention.

Referring briefly to FIG. 4, an example of how NVM 310 may be virtually partitioned in a testing mode is illustrated. In this embodiment, NVM 310 can include multiple integrated circuits, including integrated circuit 350, where the integrated circuits are illustrated by the columns 351 of NVM 310. The rows 353 may each represent a super block, where each super block includes a corresponding block of pages from each of the integrated circuits. Thus, NVM 310 may be virtually partitioned such that a portion of the super blocks can be controlled by FTL 306 as general purpose region 352 and the remaining portion of the super blocks can be controlled by test region access layer 312 as test region 354.

Returning to FIG. 3, electronic device 300 may include test application 302 and test region access layer 312 for running a test of NVM 310. Test application 302 and access layer 312 may be configured to test only the test region of NVM 310 (e.g., test region 354). The general purpose region of NVM 310 (e.g., general purpose region 352) may be used to store the program code for test application 302, other information needed for electronic device 300 to operate (e.g., firmware and system images), and/or the results of the test. To ensure that a large proportion of NVM 310 may be tested, the virtual partitions may be sized such that as much of NVM 310 as possible is allocated to the test region. For example, NVM 310 may have a 16 GB capacity, where the general purpose region is 2 GB and the test region is 14 GB, although any other partition is possible and the partition between test and general purposes regions may not occupy the entirety of NVM 310. For example, for a 16 GB memory capacity, the test region may be 12 GB, the general purpose region may be 2 GB and the remaining 2 GB may be allocated for another purpose.

Test application 302 may initiate a test of the test region of NVM 310 responsive to a user input from a user input component (not shown) of device 300. Test application 302 may work with test region access layer 312 to access each memory location in the test region of NVM 310 and may determine whether that memory location is defective or otherwise unusable. Test application 302 or test region access layer 312 may determine that a memory location is unusable if, for example, test region access layer 312 programs a test pattern to an erased memory location and a subsequent read of that memory location fails to produce the same test pattern.

To test the test region of NVM 310, test region access layer 312 may request that test patterns be written to and read from NVM 310 through software/hardware interface 308. In some embodiments, test application 302 may determine the sequence of memory locations to be tested and/or the test patterns to be written, and may send test region access layer 312 a sequence of addresses to test. In other embodiments, test region access layer 312 may determine the sequence of memory locations to be tested and/or the test patterns to be written. However, for clarify, the various embodiments are described where test application 302 makes these determinations.

Unlike requests sent through FTL 306, access layer 312 may allow test application 302 to access NVM 310 without converting a requested test address to a memory location corresponding to a completely different address. By using access layer 312, test application 302 can bypass the logical-to-physical mapping of FTL 306 so that the memory locations that are tested correspond to those requested by test application 302. That is, test application 302 may be able to work with the physical addresses of NVM 310 or in a virtual address space that access layer 312 can convert to physical addresses. In this way, unlike if a test were run through FTL 306, test application 302 can identify the specific areas of NVM 310 that may contain defects and can generate detailed statistics and logs for the test region.

Test application 302 can store the test results (e.g., logs or statistics) in the general purpose region of NVM 310. For example, test application 302 may receive test results from access layer 312 periodically as different memory locations are tested. Responsive to receiving test results for one or more memory locations from access layer 312, test application 302 can instruct file system 304 to store the test results in NVM 310. Thus, test application 302 may communicate with both file system 304 and access layer 312 at substantially the same time, and FTL 306 and test region access layer 312 may operate substantially concurrently. As such, both FTL 306 and access layer 312 may repeatedly issue read, program, and erase requests through NVM or flash software/hardware interface 308 during a test. FTL 306 may request storage of test results and access layer 312 may request that different memory locations be tested. NVM or flash software/hardware interface 308 may be configured to handle the access requests from both modules and to provide the requests to NVM 310 at appropriate intervals.

It should be understood that FIGS. 2 and 3 are merely illustrative, and that electronic devices 200 and 300 can include additional components, or the illustrated components may be modified, combined, or removed without departing from the scope of the invention. For example, in some embodiments, a file system and NVM translation layer can be integrated into a single module (e.g., when using a YAFFS file system), and are therefore not necessarily separate entities as shown in FIGS. 2 and 3.

Figure 5:
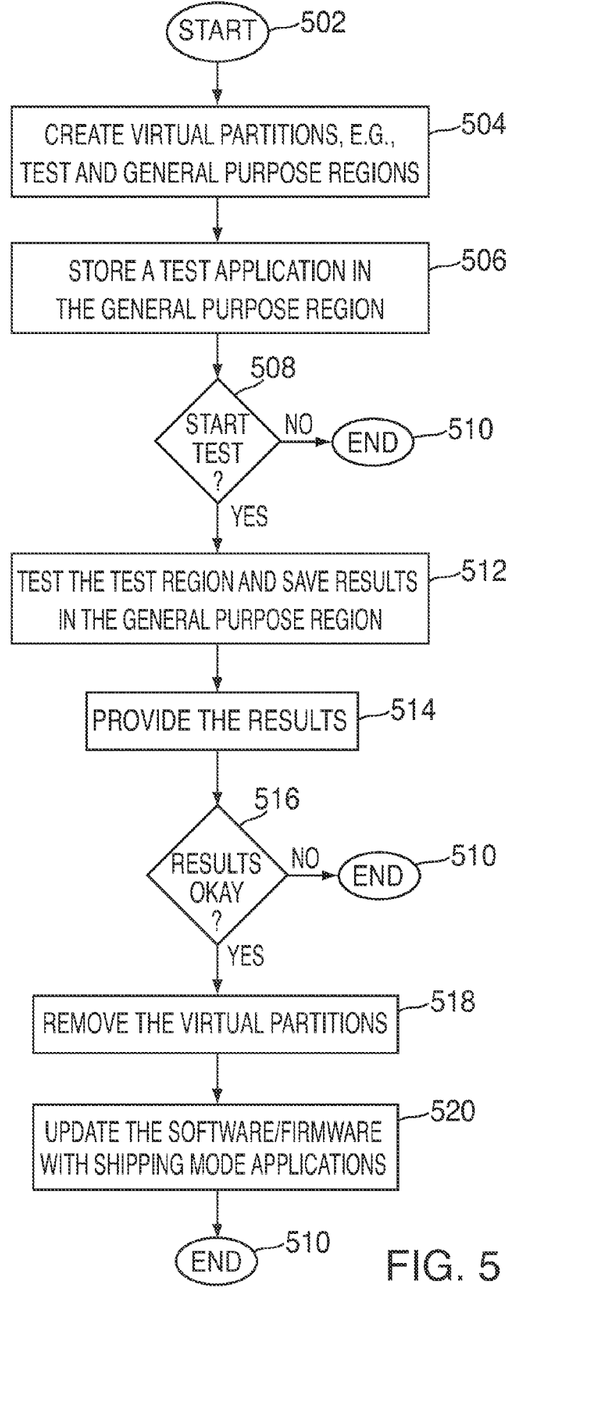
FIG. 5 is a flowchart of an illustrative process for preparing an electronic device including a non-volatile memory for shipment in accordance with some embodiments of the invention.

Referring now to FIG. 5, a flowchart of an illustrative process 500 is shown for preparing an electronic device for shipment. The electronic device can include a non-volatile memory, such as a flash memory, and electronic device may be the same or similar to electronic devices 100 or 300 of FIGS. 1 and 3, respectively. Process 500 may begin at step 502. At step 504, virtual partitions in the NVM may be created. In particular, step 504 may involve initializing the NVM using a general firmware and software update such that a general purpose region and a test region are created.

Then, at step 506, a test application may be stored in the general purpose region. For example, the test application may be loaded during the general firmware and software update. In these embodiments, following step 506, the general purpose region can include the test application, updated firmware, and any other data or program code necessary for the operation of the electronic device (e.g., system images). The test region may be blank.

Continuing to step 508, a determination can be made as to whether a test of the NVM should be initiated. This determination may be based on whether the test application receives a user input to start a test of the test region. If a test should not be started, process 500 can move to step 510 and end. Otherwise, process 500 can continue to step 512. At step 512, the test region of the NVM may be tested and the results may be saved in the general purpose region. To test the test region at step 512, the test application may be executed.

Then, at step 514, the results of the test may be provided to a user. For example, the test results may be displayed on a display of the electronic device. In some embodiments, the results of the test may be sent over a communications line (e.g., over a wired or wireless link) for processing or viewing by the user. The results can include pass/fail or defect indicators for each location in the test region. In this way, the user can determine the general characteristics and topography of the defects present in the non-volatile memory. In some embodiments, the electronic device may display or transmit results or portions of the log to the user during the test, and not just at step 514 after the test. The electronic device may therefore provide intermediate results of test, final results, or both.

Process 500 may continue to step 516, and the user of the electronic device or the device itself may determine whether the test results are satisfactory. For example, in some embodiments, based on viewing the display of results, the user can determine whether the quality of the NVM is good enough to allow shipment of the electronic device. In other embodiments, the electronic device can automatically determine whether the characteristics of the defects are within a tolerable range. If, at step 516, it is determined that the test results are unsatisfactory, process 500 can move to step 510 and end. In this case, the electronic device may not be shipped with the current NVM.

If, at step 516, it is determined that the test results are satisfactory, process 500 can continue to step 518. At step 518, the virtual partitions may be removed and the entire NVM may be controlled by a translation layer (e.g., a flash translation layer). Then, at step 520, the software and/or firmware may be updated with shipping mode applications. Thus, following steps 518 and 520, the electronic device may be reconfigured from a testing mode to a shipping mode. Steps 518 and 520 may involve performing a software or firmware update, because reformatting of the NVM may not be necessary. Process 500 may then end at step 510 with the electronic device ready for shipment or distribution.

Figure 6:
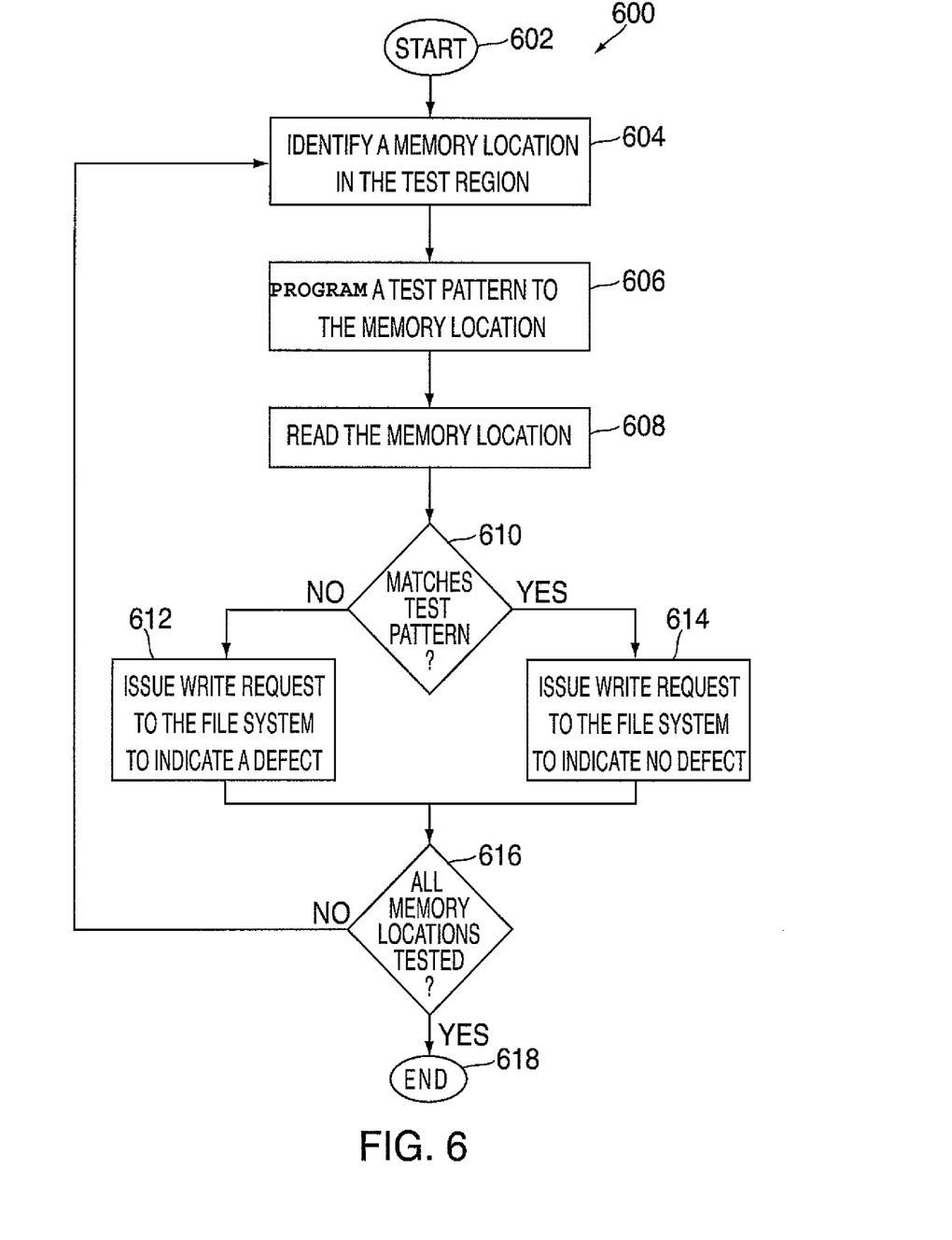
FIG. 6 is a flowchart of an illustrative process for testing a non-volatile memory in accordance with some embodiments of the invention.

Turning to FIG. 6, a flowchart of an illustrative process 600 for testing a non-volatile memory is shown. Process 600 may be a more detailed view of testing step 612 of process 500 of FIG. 5. The steps of process 600 may be executed by a test application and/or a test region access layer, such as test application 302 and test region access layer 312 of FIG. 3.

Process 600 may start at step 602. At step 604, the test application can identify a memory location in a test region of the non-volatile memory. Then, at step 606, the test application can program a test pattern to the identified memory location. In some embodiments, this can involve determining an address corresponding to an actual location in the test region, and requesting that the memory driver (e.g., test region access layer 312) program the test pattern at that physical location. In some embodiments, step 606 can also include erasing the corresponding block if the block is not already erased. Because the request is not made though a file system and translation layer that maps the requested address to another address, the test application may program the location in the NVM specified by the application.

Then, at step 608, the test application can read the identified memory location and can, at step 610, determine whether the read operation produced a vector that matches the test pattern. If not, the test application can issue a write request to the file system to indicate that a defect exists at that memory location at step 612. For example, the test application can log the physical address of the tested memory location, which the test application can obtain from the test region access layer, along with a "fail" indicator. If a match is instead determined at step 610, the test application can issue a write request to the file system to indicate that a defect does not exist at that memory location. Thus, a log of the test may be generated, and because the write operation is issued through the file system, the log may be saved in a general purpose region of the NVM.

Moving to step 616, the test application can determine whether all memory locations of the test region have been tested. If so, process 600 may move to step 618 and end. Otherwise, process 600 may return to step 604, where the test application can select another memory location to be tested. Thus, using the iterative steps of process 600, the test application can test each memory location in a test region and provide information about those locations to a general purpose region. In some embodiments, the test application can write the raw information (e.g., pass/fail information for each memory location or how each defective memory location failed) received from the access layer to the general purpose region. In other embodiments, the test application can process the received information before writing the processed results to the general purpose region and/or can perform post-processing on the results.

It should be understood that the steps of processes 500 and 600 are merely illustrative. Any of the steps may be removed, modified, or combined, and any other steps may be added, without departing from the scope of the invention.

Process 600 illustrates a test on a non-volatile memory where one memory location is programmed and read before moving on to another memory location. This is merely one strategy for completing a test. In some embodiments, the test application can instead direct the access layer to first erase all of the blocks in the test region, then program all of the pages in the test region with a suitable test pattern, and finally read all of the pages in the test region. This flow of erase-program-read operations may allow the test application to detect and assess disturb issues. The disturb issues can include any read/program/erase disturbs that may result when one operation affects the content of previously stored data in nearby cells.

The above described embodiments of the invention are presented for the purpose of illustration and not of limitation, and the invention is only limited by the claims which follow.

What is claimed is:

1. A method of testing a non-volatile memory, the method comprising:
   virtually partitioning the non-volatile memory into first and second regions;
   storing a test application in the first region of the non-volatile memory;
   executing the test application to run a test of the second region of the non-volatile memory; wherein the executing the test application comprises:
   (a) erasing a block of the second region;
   (b) programming a test pattern to a page of the second region in the erased block;
   (c) performing a read operation on the page; and
   (d) determining whether the read operation produces the test pattern;
   and
   removing the virtual partitioning.

2. The method of claim 1, further comprising storing results of the test in the first region of the non-volatile memory.

3. The method of claim 1, wherein the non-volatile memory is of an electronic device, the method further comprising evaluating the results using the electronic device.

4. The method of claim 1, further comprising displaying the results of the test to a user.

5. The method of claim 4, wherein the displaying occurs during the executing, after the executing, or both during and after the executing.

6. The method of claim 1, wherein the virtually partitioning comprises:
   giving control of physical addresses corresponding to the first region to a first software module; and
   giving control of physical addresses corresponding to the second region to a second software module.

7. A method of testing a non-volatile memory, the method comprising:
   virtually partitioning the non-volatile memory into first and second regions;
   storing a test application in the first region of the non-volatile memory; and
   executing the test application to run a test of the second region of the non-volatile memory, wherein the executing the test application comprises:
   (a) erasing a block of the second region;
   (b) programming a test pattern to a page of the second region in the erased block;
   (c) performing a read operation on the page; and
   (d) determining whether the read operation produces the test pattern.

8. The method of claim 7, further comprising: (e) repeating steps (a)-(d) for a plurality of portions in the second region.

9. A method of preparing an electronic device for shipment, the electronic device comprising a non-volatile memory, the method comprising:
   creating first and second virtual partitions of the non-volatile memory;
   testing the second virtual partition;
   storing results of the testing in the first virtual partition; and
   removing the virtual partitions before shipment of the electronic device,
   wherein said testing the second virtual partition comprises:
   (a) erasing a block of the second region;
   (b) programming a test pattern to a page of the second region in the erased block;
   (c) performing a read operation on the page; and
   (d) determining whether the read operation produces the test pattern.

10. The method of claim 9, further comprising determining whether the results of the testing meet a predetermined specification, wherein the removing is performed responsive to the determining.

11. The method of claim 10, wherein the determining is performed by the electronic device.

12. The method of claim 9, wherein the creating comprises performing at least one of a firmware update of the electronic device and a software update of the electronic device.

13. The method of claim 9, wherein the testing comprises identifying memory locations in the second virtual partition that contain defects.

14. The method of claim 9, wherein the testing comprises executing a test application stored in the first virtual partition.

15. The method of claim 14, further comprising loading the non-volatile memory with a shipping application after the removing.

16. The method of claim 9, wherein the storing occurs during the testing.

17. An electronic device comprising:
a non-volatile memory; and
a system-on-a-chip comprising control circuitry configured to operate under the control of a plurality of modules, the modules comprising:
  a test application;
  a translation layer for controlling access by the test application to a first portion of the non-volatile memory; and
  an access layer for controlling access by the test application to a second portion of the non-volatile memory,
wherein the test application is configured to test the second region of the non-volatile memory using the access layer by:
  (a) erasing a block of the second region;
  (b) programming a test pattern to a page of the second region in the erased block;
  (c) performing a read operation on the page; and
  (d) determining whether the read operation produces the test pattern.

18. The electronic device of claim 17, wherein the translation layer and the access layer are software modules.

19. The electronic device of claim 17, wherein the non-volatile memory comprises a flash memory and the translation layer comprises a flash translation layer.

20. The electronic device of claim 17, wherein the plurality of modules further comprise a file system for interfacing the test application with the translation layer.

21. The electronic device of claim 20, wherein the file system is configured to provide logical addresses to the translation layer, and wherein the translation layer is configured to convert the logical addresses to physical addresses corresponding to memory locations in the first portion of the non-volatile memory.

22. The electronic device of claim 17, wherein the modules further comprise a software/hardware interface for communicating with the non-volatile memory, wherein the software/hardware interface is configured to access the non-volatile memory responsive to commands from the translation layer and the access layer.

23. The electronic device of claim 17, wherein the test application is configured to:
  receive test results for the second region of the non-volatile memory from the access layer; and
  store the test results in the first region of the non-volatile memory using the translation layer.

* * * * *

UNITED STATES PATENT AND TRADEMARK OFFICE
CERTIFICATE OF CORRECTION

PATENT NO. : 8,683,456 B2  
APPLICATION NO. : 12/502128  
DATED : March 25, 2014  
INVENTOR(S) : Matthew Byom et al.

Page 1 of 1

It is certified that error appears in the above-identified patent and that said Letters Patent is hereby corrected as shown below:

On The Title Page

On Page 2, Column 1, in Item "(56)", under "OTHER PUBLICATIONS", Line 5, delete "Ginn;," and insert -- Gim, --, therefor.

In the Specification

In Column 7, Line 10, delete "clarify," and insert -- clarity, --, therefor.

In the Claims

In Column 9, Line 66, Claim 1, delete "memory; wherein" and insert -- memory, wherein --, therefor.

Signed and Sealed this  
Twelfth Day of January, 2016

Michelle K. Lee  
*Director of the United States Patent and Trademark Office*